(12) United States Patent
Hayashi

(10) Patent No.: US 6,456,468 B1
(45) Date of Patent: Sep. 24, 2002

(54) MAGNETORESISTANCE EFFECT ELEMENT, AND MAGNETORESISTANCE EFFECT SENSOR AND MAGNETIC INFORMATION RECORDING AND PLAYBACK SYSTEM USING SAME

(75) Inventor: Kazuhiko Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 178 days.

(21) Appl. No.: 09/593,509

(22) Filed: Jun. 14, 2000

Related U.S. Application Data

(62) Division of application No. 09/042,556, filed on Mar. 17, 1998, now Pat. No. 6,114,850.

(30) Foreign Application Priority Data

Mar. 18, 1997 (JP) .............................................. 9-064265

(51) Int. Cl.⁷ .............................................. G11B 5/127
(52) U.S. Cl. .................................................. 360/324.1
(58) Field of Search ......................... 360/324.1, 324.11, 360/324.2, 315, 125, 126; 324/252

(56) References Cited

U.S. PATENT DOCUMENTS

| 5,914,839 A | * | 6/1999 | Matsuzono et al. | ......... | 360/315 |
| 5,986,858 A | * | 11/1999 | Sato et al. | ............... | 360/324.2 |
| 6,134,090 A | * | 10/2000 | Mao et al. | ............... | 360/324.1 |

FOREIGN PATENT DOCUMENTS

| JP | 2-61572 | 3/1990 |
| JP | 4-358310 | 12/1992 |
| JP | 6-203340 | 7/1994 |
| JP | 6-214837 | 9/1994 |
| JP | 7-136670 | 6/1995 |
| JP | 7-202292 | 8/1995 |
| JP | 7-262529 | 10/1995 |
| JP | 7-509811 | 10/1995 |
| JP | 8-127864 | 5/1996 |
| JP | 8-153314 | 6/1996 |
| JP | 8-204253 | 8/1996 |
| JP | 9-50611 | 2/1997 |
| JP | 10-41561 | 2/1998 |

OTHER PUBLICATIONS

David A. Thompson et al., "Thin Film Magnetoresistors in Memory, Storage, and Related Applications," *IEEE Transactions on Magnetics*, vol. Mag–11, No. 4, Jul. 1975, pp. 1039–1050.

* cited by examiner

Primary Examiner—Allen Cao
(74) Attorney, Agent, or Firm—Sughrue Mion, PLLC

(57) ABSTRACT

The magnetoresistance effect element according to the present invention comprises an anti-ferromagnetic layer, a fixed magnetic layer, a non-magnetic layer and a free magnetic layer laminated successively onto a base layer. The anti-ferromagnetic layer is a single layer film or multiple layer film comprising Ni oxide, Co oxide or Fe oxide as a principal component, or a mixture of these. An adhesive layer for preventing peeling due to heat generated by the flow of current is provided between the base layer and the anti-ferromagnetic layer.

By providing an adhesive layer between the base layer and the ferromagnetic layer in this way, the adhesive force between the base layer and the anti-ferromagnetic layer is increased, and therefore peeling and the like does not arise even when temperature changes occur in the magnetoresistance effect element.

2 Claims, 14 Drawing Sheets

F I G. 1
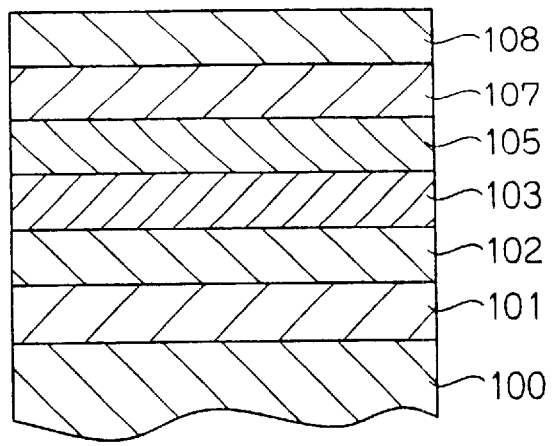
F I G. 2
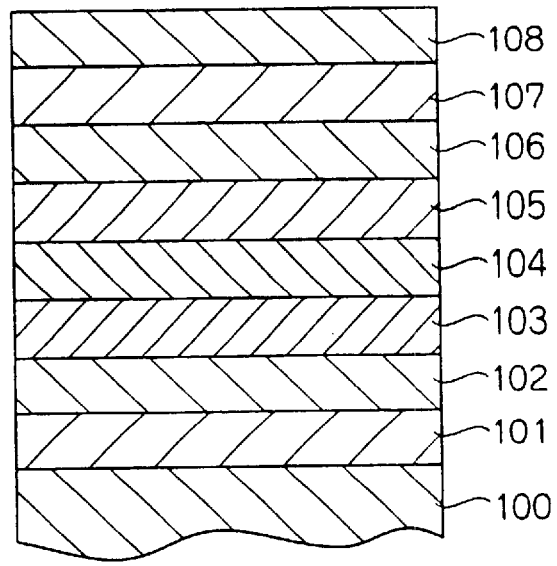

F I G. 7

| ANTI-FERROMAGNETIC MATERIAL | ADHESIVE FORCE WITH ALUMINA BASE LAYER (Gpa) | ADHESIVE FORCE WITH SiO2 BASE LAYER (Gpa) |
|---|---|---|
| Ni OXIDE | 20 | 31 |
| Co OXIDE | 22 | 33 |
| Fe OXIDE | 27 | 36 |

FIG. 8

| THIN FILM MATERIAL | ADHESIVE FORCE WITH ALUMINA BASE LAYER (Gpa) | ADHESIVE FORCE WITH SiO2 BASE LAYER (Gpa) |
|---|---|---|
| Ta | 51 | 62 |
| Ta OXIDE | 45 | 51 |
| Ti | 48 | 49 |
| Ti OXIDE | 42 | 46 |
| Cr | 52 | 67 |
| Cr OXIDE | 47 | 47 |
| V | 48 | 53 |
| V OXIDE | 46 | 48 |
| Fe | 47 | 48 |
| Co | 48 | 48 |
| Ni | 47 | 49 |
| Zr | 52 | 59 |
| Zr OXIDE | 49 | 51 |
| Nb | 50 | 61 |
| Nb OXIDE | 47 | 49 |
| Mo | 49 | 59 |
| Mo OXIDE | 46 | 46 |
| Hf | 46 | 54 |
| Hf OXIDE | 45 | 53 |
| W | 47 | 56 |
| W OXIDE | 43 | 46 |

F I G. 9

| THIN FILM MATERIAL | Ni OXIDE | Co OXIDE | Fe OXIDE |
|---|---|---|---|
| Ta | 48 | 49 | 47 |
| Ta OXIDE | 49 | 51 | 48 |
| Ti | 48 | 50 | 50 |
| Ti OXIDE | 45 | 47 | 46 |
| Cr | 49 | 51 | 51 |
| Cr OXIDE | 46 | 45 | 45 |
| V | 50 | 51 | 53 |
| V OXIDE | 49 | 50 | 52 |
| Fe | 48 | 46 | 46 |
| Co | 50 | 51 | 51 |
| Ni | 47 | 52 | 49 |
| Zr | 49 | 49 | 51 |
| Zr OXIDE | 48 | 50 | 47 |
| Nb | 48 | 49 | 51 |
| Nb OXIDE | 49 | 51 | 52 |
| Mo | 53 | 50 | 59 |
| Mo OXIDE | 50 | 49 | 49 |
| Hf | 48 | 47 | 52 |
| Hf OXIDE | 46 | 46 | 48 |
| W | 49 | 47 | 53 |
| W OXIDE | 45 | 46 | 46 |

FIG.10

| BASE LAYER | TIME AT WHICH BURN OUT OCCURRED (HOURS) |
|---|---|
| GLASS (NO BASE LAYER) | 45 |
| Si OXIDE | 54 |
| Si NITRIDE | 43 |
| Al OXIDE | 95 |
| Al NITRIDE | 47 |

FIG.11

| ADHESIVE LAYER \ BASE LAYER | Si OXIDE | Si NITRIDE | Al OXIDE | Al NITRIDE | GLASS (NO BASE LAYER) |
|---|---|---|---|---|---|
| Ta | 125 | 126 | 147 | 137 | 118 |
| Ta OXIDE | 87 | 90 | 86 | 98 | 82 |
| Ti | 117 | 125 | 130 | 123 | 108 |
| Ti OXIDE | 92 | 97 | 88 | 96 | 86 |
| Cr | 127 | 128 | 146 | 133 | 108 |
| Cr OXIDE | 97 | 85 | 105 | 93 | 91 |
| V | 126 | 111 | 127 | 119 | 104 |
| V OXIDE | 113 | 115 | 109 | 108 | 99 |
| Fe | 115 | 117 | 135 | 118 | 106 |
| Co | 118 | 119 | 125 | 110 | 102 |
| Ni | 116 | 118 | 112 | 125 | 107 |
| Zr | 158 | 175 | 189 | 163 | 136 |
| Zr OXIDE | 144 | 143 | 154 | 149 | 137 |
| Nb | 149 | 145 | 191 | 165 | 137 |
| Nb OXIDE | 133 | 137 | 144 | 139 | 136 |
| Mo | 132 | 126 | 157 | 135 | 128 |
| Mo OXIDE | 127 | 132 | 152 | 128 | 131 |
| Hf | 142 | 141 | 149 | 123 | 126 |
| Hf OXIDE | 141 | 145 | 165 | 145 | 139 |
| W | 141 | 152 | 162 | 161 | 133 |
| W OXIDE | 136 | 138 | 139 | 127 | 125 |

F I G. 1 2

| BASE LAYER | TIME AT WHICH BURN OUT OCCURRED (HOURS) |
|---|---|
| GLASS (NO BASE LAYER) | 42 |
| Si OXIDE | 50 |
| Si NITRIDE | 41 |
| Al OXIDE | 68 |
| Al NITRIDE | 45 |

FIG.13

| ADHESIVE LAYER \ BASE LAYER | Si OXIDE | Si NITRIDE | Al OXIDE | Al NITRIDE | GLASS (NO BASE LAYER) |
|---|---|---|---|---|---|
| Ta | 117 | 125 | 140 | 136 | 111 |
| Ta OXIDE | 85 | 88 | 82 | 92 | 77 |
| Ti | 114 | 121 | 122 | 117 | 104 |
| Ti OXIDE | 89 | 92 | 85 | 94 | 88 |
| Cr | 126 | 125 | 133 | 132 | 101 |
| Cr OXIDE | 88 | 82 | 88 | 86 | 84 |
| V | 111 | 108 | 125 | 117 | 101 |
| Fe | 116 | 114 | 133 | 114 | 110 |
| Co | 117 | 108 | 127 | 117 | 112 |
| Ni | 112 | 119 | 117 | 122 | 104 |
| Zr | 142 | 168 | 164 | 157 | 127 |
| Nb | 151 | 141 | 175 | 166 | 124 |
| Mo | 130 | 122 | 154 | 158 | 117 |
| Hf | 131 | 135 | 137 | 121 | 125 |
| W | 139 | 146 | 148 | 157 | 127 |

F I G. 1 4

| BASE LAYER | TIME AT WHICH BURN OUT OCCURRED (HOURS) |
|---|---|
| GLASS (NO BASE LAYER) | 38 |
| Si OXIDE | 46 |
| Si NITRIDE | 39 |
| Al OXIDE | 45 |
| Al NITRIDE | 39 |

FIG.15

| ADHESIVE LAYER \ BASE LAYER | Si OXIDE | Si NITRIDE | Al OXIDE | Al NITRIDE | GLASS (NO BASE LAYER) |
|---|---|---|---|---|---|
| Ta | 108 | 114 | 135 | 128 | 108 |
| Ta OXIDE | 82 | 84 | 79 | 85 | 75 |
| Ti | 112 | 117 | 119 | 110 | 100 |
| Ti OXIDE | 82 | 98 | 88 | 95 | 88 |
| Cr | 131 | 124 | 136 | 124 | 111 |
| Cr OXIDE | 84 | 81 | 86 | 86 | 87 |
| V | 107 | 111 | 129 | 117 | 115 |
| Fe | 108 | 114 | 124 | 110 | 118 |
| Co | 110 | 118 | 127 | 117 | 116 |
| Ni | 118 | 124 | 116 | 118 | 116 |
| Zr | 135 | 148 | 147 | 135 | 118 |
| Nb | 145 | 165 | 185 | 117 | 113 |
| Mo | 148 | 149 | 178 | 165 | 145 |
| Hf | 139 | 135 | 145 | 136 | 138 |
| W | 128 | 122 | 145 | 158 | 135 |

FIG.16

| FIXED MAGNETIC LAYER | CHANGE IN RESISTANCE (%) | RESISTIVITY ($\mu\Omega$cm) | CHANGE IN RESISTIVITY ($\mu\Omega$cm) |
|---|---|---|---|
| $Co_{92}Zr_8$ | 6.5 | 50 | 3.2 |
| $Co_{83}Zr_{17}$ | 5 | 62 | 3.1 |
| $Co_{92}Hf_8$ | 6.2 | 52 | 3.2 |
| $Co_{83}Ta_{17}$ | 5.3 | 64 | 3.4 |
| $Co_{93}Ta_7$ | 6.4 | 51 | 3.3 |
| $Co_{92}Zr_3Nb_5$ | 6.7 | 63 | 4.2 |
| $Co_{92}Hf_5Pd_3$ | 6.5 | 63 | 4.1 |
| $Co_{88}Ta_8Hf_4$ | 5.8 | 59 | 3.4 |
| $Co_{87}Nb_9Hf_4$ | 5.5 | 57 | 3.1 |
| $Co_{87}Ta_9Zr_4$ | 5.4 | 59 | 3.2 |
| $Co_{86}Nb_9Zr_5$ | 5.8 | 61 | 3.5 |
| $Co_{92}Zr_4Ta_4$ | 6.1 | 58 | 3.5 |
| $Co_{79}Zr_{10}Mo_9Ni_2$ | 5.8 | 66 | 3.8 |
| $Co_{82.5}Zr_{5.5}Ta_4Nb_8$ | 5.5 | 62 | 3.4 |
| $Co_{74}Zr_6Mo_{20}$ | 5.8 | 70 | 4.1 |
| $Co_{72}Fe_8B_{20}$ | 4.9 | 72 | 3.5 |

MAGNETORESISTANCE EFFECT ELEMENT, AND MAGNETORESISTANCE EFFECT SENSOR AND MAGNETIC INFORMATION RECORDING AND PLAYBACK SYSTEM USING SAME

This is a divisional of application Ser. No. 09/042,556 filed Mar. 17, 1998, U.S. Pat. No. 6,114,850 the disclosure of which is incorporated herein by reference.

Priority is claimed from Mar. 18, 1997 based on JP Application No. 9-064265. The priority document was filed in parent application Ser. No. 09/042,556.

BACKGROUND OF THE INVENTION

1. Field of the Invention

The present invention relates to a magnetoresistance effect element, and a magnetoresistance effect sensor and magnetic information detecting system using same, and more particularly, to a magnetoresistance effect element for reading magnetic information recorded on a magnetic recording medium, and a magnetoresistance effect sensor and magnetic information detecting system using same.

2. Description of the Related Art

In the prior art, magnetic reading converters called magnetic resistance (MR) sensors or MR heads are known. These read data from the surface of a magnetic recording medium at a large linear density. MR sensors and the like detect a magnetic field by detecting changes in resistance produced by reading elements in accordance with the surrounding magnetic field, and converting these changes to a magnetic field signal. In this, a magnetic signal detected by a reading element is detected as a function of the strength and direction of the magnetic flux. In a conventional MR sensor of this kind, one component of the resistance of the reading element changes in proportion to the square of the cosine ($COS^2$) of the angle between the direction of magnetization and direction in which the sensor current flows through the element. This is called the 'anisotropic magnetic resistance' (AMR) effect.

This AMR effect is commonly known and therefore is not described here, but a detailed explanation thereof can be found, for example, in "Memory, Storage and Related Applications," IEEE Trans. on Mag. MAG-11, p.1039 (1975), by D. A. Thompson, et. al. In magnetic heads using the AMR effect, often a longitudinal bias is applied in order to suppress Barkhausen noise, and in some cases, an anti-ferromagnetic material, such as FeMn, NiMn, nickel oxide, or the like, is used as a material for supplying this longitudinal bias.

Furthermore, recently, in resistance change in laminated magnetic sensors, remarkable magnetoresistance effects have been discovered due to spin-dependent transmissivity of conducting electrons between magnetic layers which are placed either side of a non-magnetic layer, and spin-dependent scattering at the accompanying layer interfaces. This magnetoresistance effect is known by various names, including "massive magnetoresistance effect" or "spin valve effect", or the like. Magnetic resistance sensors of this type are made from suitable materials, and they have improved sensitivity and display a greater resistance change with respect to magnetic field compared to sensors using the AMR effect. In MR sensors of this kind, the internal resistance in the plane between the ferromagnetic layers separated by a non-magnetic layer is proportional to the cosine of the angle between the directions of magnetization of the two layers. Japanese Unexamined Patent 2-61572 which has a claim of priority based on an application dated Jun. 16$^{th}$, 1988 discloses a laminated magnetic structure which produces a high MR effect caused by non-parallel arrangement of the magnetization of the magnetic layers. In the aforementioned patent, ferromagnetic transition metals and alloys are cited as materials which can be used in this laminated magnetic structure. Furthermore, the patent also discloses that it is suitable to add an anti-ferromagnetic layer as one of the at least two magnetic layers separated by an intermediate layer, and FeMn is appropriate for this anti-ferromagnetic layer. A further MR sensor is disclosed in Japanese Unexamined Patent 4-358310 which has a claim of priority based on an application dated Dec. 11$^{th}$, 1990. This MR sensor comprises two thin film layers of ferromagnetic material divided by a thin film layer of non-magnetic metallic material. When the applied magnetic field is zero, the directions of magnetization of the two ferromagnetic thin film layers are orthogonal, and the resistance between the two unconnected ferromagnetic layers changes in direct proportion to the cosine of the angle between the directions of magnetization of the two layers, thereby producing an MR sensor which is not dependent on the direction of the electric current flowing through the MR sensor. Japanese Unexamined Patent 6-203340 which has a claim of priority based on an application dated Nov. 17$^{th}$, 1992 discloses an MR sensor which incorporates two thin film layers of ferromagnetic material separated by a thin film layer of non-magnetic metallic material. This MR sensor is based on the effect that when the applied external magnetic field is zero, the magnetization of the adjacent anti-ferromagnetic layer remains orthogonal with respect to the other ferromagnetic layer.

Furthermore, Japanese Unexamined Patent 7-262529 (application dated Mar. 24$^{th}$, 1994) discloses a magnetoresistance effect element which is a spin valve comprising a first magnetic layer/non-magnetic layer/second magnetic layer/anti-ferromagnetic, and more particularly one which uses CoZrNb, CoZrMo, FeSiAl, FeSi, or NiFe, or a material wherein Cr, Mn, Pt, Ni, Cu, Ag, Al, Ti, Fe, Co, or Zn is added to these, in the first and second magnetic layers.

Furthermore, Japanese Unexamined Patent 7-202292 (application dated Dec. 27$^{th}$, 1993) discloses a magnetoresistance effect film characterized in that, in a magnetoresistance effect film comprising a plurality of magnetic thin films laminated between non-magnetic layers on a substrate, wherein an anti-ferromagnetic thin film is provided in one of the soft magnetic thin layers which are mutually adjacent via the non-magnetic thin layer, and Hc2<Hr, taking the bias magnetic field of this anti-ferromagnetic thin film as Hr and the coercive force of the oth erromagnetic thin film as Hc2, the aforementioned anti-ferromagnetic material is at least one of NiO, CoO, FeO, $Fe_2O_3$, MnO, or Cr, or a mixture of these.

Furthermore, Japanese Patent Application 6-21487 (application dated Sep. 8$^{th}$, 1994) and Japanese Patent Application 6-269524 (application dated Nov. 2$^{nd}$, 1994) propose a magnetoresistance effect film characterized in that, i the aforementioned magnetoresistance effect film, the anti-ferromagnetic material is a superlattice comprising at least two of NiO, NiXCol-XO and CoO. Japanese Patent Application 7-11354 (application dated Jan. 27$^{th}$, 1995) proposes a magnetoresistance effect film characterized in that, in the aforementioned magnetoresistance effect film, the anti-ferromagnetic material is a superlattice comprising at least two of NiO, NiXCol-XO (x=0.1–0.9) and CoO, and the atomic ratio of Ni with respect to Co in this superlattice is equal to or greater than 1.0. Japanese Patent Application 7-136670 (application dated June $2^{nd}$, 1995) proposes a magnetoresistance effect film characterized in that, in the aforementioned magnetoresistance effect film, the anti-ferromagnetic material has a two-layer structure comprising CoO laminated to a thickness of 10–40 Angstrom on NiO. However, the magnetoresistance effect films using oxides in the anti-ferromagnetic layer, as disclosed in the aforementioned patent publications and applications, are subject to great stress in the oxide anti-ferromagnetic layer, and therefore a problem arises in that the anti-ferromagnetic layer peels away from the base layer due to local current heating effects when the sensor current passes through the element, thereby causing the element to break down.

SUMMARY OF THE INVENTION

The present invention was devised in order to resolve the aforementioned problems, and specifically, an object thereof is to provide an magnetoresistance effect element having excellent current tolerance characteristics such that the element does not break down due to peeling when the sensor current is passed, by adopting a composition wherein sufficient adhesive force is provided between the base layer and the anti-ferromagnetic layer.

It is a further object of the present invention to provide a magnetoresistance effect sensor and magnetic information detecting system having satisfactory properties, which use this magnetoresistance effect element having excellent current tolerance characteristics.

In order to achieve the aforementioned objects, in a magnetoresistance effect element wherein an anti-ferromagnetic layer, a fixed magnetic layer, a non-magnetic layer and a free magnetic layer are laminated successively onto a base layer, the magnetoresistance effect element according to the present invention comprises an adhesive layer for preventing peeling when current is passed, placed between the base layer and the anti-ferromagnetic layer formed by a single layer or multiple layers having Ni oxide, Co oxide or Fe oxide as a principal component, or a combination of these.

Furthermore, in a magnetoresistance effect element wherein an anti-ferromagnetic layer, a fixed magnetic layer, a non-magnetic layer and a free magnetic layer are laminated successively onto a base layer, and an enhancing layer is formed between the fixed magnetic layer and the non-magnetic layer and/or between the non-magnetic layer and the free magnetic layer, the magnetoresistance effect element according to the present invention comprises an adhesive layer for preventing peeling when current is passed, placed between the base layer and the anti-ferromagnetic layer formed by a single layer or multiple layers having Ni oxide, Co oxide or Fe oxide as a principal component, or a combination of Ni oxide, Co oxide or Fe oxide.

FIG. 7 shows adhesive force in a cases where alumina or $SiO_2$ is used for the aforementioned base layer, and Ni oxide, Co oxide or Fe oxide are used in the anti-ferromagnetic layer. In contrast to this, the present invention is provided with an adhesive layer between the base layer and the oxide anti-ferromagnetic layer. FIG. 8 shows adhesive force (Gpa) at both interfaces in cases where alumina or $SiO_2$ is used for the base layer, similarly to the foregoing, and a thin film of the different materials listed in the diagram is formed thereonto as an adhesive layer.

Moreover, FIG. 9 shows adhesive force (Gpa) at both interfaces in cases where a thin film of one of the materials listed in the diagram is used as an adhesive layer and Ni oxide, Co oxide or Fe oxide are formed thereonto as the anti-ferromagnetic layer.

The adhesive force between the various thin film materials given in FIG. 8 and the alumina or $SiO_2$ film, and the adhesive force between the various thin film materials given in FIG. 9 and the Ni oxide, Co oxide or Fe oxide is greater in all cases than the bonding force between the alumina or $SiO_2$ and Ni oxide, Co oxide or Fe oxide, as shown in FIG. 7. This means that the adhesive force between the alumina or $SiO_2$ and Ni oxide, Co oxide or Fe oxide is increased by inserting one of the thin film materials given in FIG. 8 and FIG. 9 as an adhesive layer between the base layer of alumina or $SiO_2$ and the anti-ferromagnetic layer of Ni oxide, Co oxide or Fe oxide.

Furthermore, the present invention uses a magnetoresistance effect element having an adhesive layer as the aforementioned magnetoresistance effect element in a shielded magnetoresistance effect sensor having a structure wherein a lower shield layer, a lower gap layer and a patterned magnetoresistance effect element are laminated successively onto a substrate, a longitudinal bias layer and lower electrode layer are laminated successively thereonto such that they contact the terminal section of the magnetoresistance effect element or overlap partially therewith, and an upper gap layer and upper shield layer are laminated successively onto the magnetoresistance effect element, longitudinal bias layer and the lower electrode layer.

Moreover, the present invention uses a magnetoresistance effect element having an adhesive layer as the aforementioned magnetoresistance effect element in a magnetic information detecting system comprising a magnetoresistance effect element, means for generating a current to pass through the magnetoresistance effect element, and means for detecting changes in the resistivity of the magnetoresistance effect element as a function of a detected magnetic field. The magnetic recording device according to the present invention may also be constituted using this magnetic information detecting system.

BRIEF DESCRIPTION OF THE DRAWINGS

FIG. 1 is a compositional example of a first embodiment of a magnetoresistance effect element according to the present invention;

FIG. 2 is a compositional example of a second embodiment of a magnetoresistance effect element according to the present invention;

FIG. 7 is a table showing adhesive force in cases where alumina or $SiO_2$ is used in the aforementioned base layer and Ni oxide, Co oxide or Fe oxide is used in the aforementioned anti-ferromagnetic layer;

FIG. 8 is a table showing adhesive force at both interfaces in cases where alumina or $SiO_2$ is used in the base layer and a thin film of one of various materials is formed thereonto;

FIG. 9 is a table showing adhesive force at both interfaces in cases where one of various thin film materials is used as an adhesive layer, and Ni oxide, Co oxide or Fe oxide is formed thereonto as an anti-ferromagnetic layer;

FIG. 10 is a table showing the time at which magnetoresistance effect elements having different base layers burn out in a high-temperature current test conducted at an environmental temperature of 120° C. and a current density of $3\times10^7$ A/cm$^2$;

FIG. 11 is a table showing the time at which a magnetoresistance effect element burns out in a high-temperature current test conducted at an environmental temperature of 120° C. and a current density of $3\times10^7$ A/cm$^2$, with respect to magnetoresistance effect elements comprising different materials as an adhesive layer;

FIG. 12 is a table showing the time at which a magnetoresistance effect element burns out in a high-temperature current test conducted at an environmental temperature of 120° C. and a current density of $3\times10^7$ A/cm$^2$, with respect to magnetoresistance effect elements having no adhesive layer;

FIG. 13 is a table showing the time at which a magnetoresistance effect element burns out in a high-temperature current test conducted at an environmental temperature of 120° C. and a current density of $3\times10^7$ A/cm$^2$, with respect to magnetoresistance effect elements comprising Ta and the like as an adhesive layer;

FIG. 14 is a table showing the time at which a magnetoresistance effect element burns out in a high-temperature current test conducted at an environmental temperature of 120° C. and a current density of $3\times10^7$ A/cm$^2$, with respect to magnetoresistance effect elements having no adhesive layer;

FIG. 15 is a table showing the time at which a magnetoresistance effect element burns out in a high-temperature current test conducted at an environmental temperature of 120° C. and a current density of $3\times10^7$ A/cm$^2$, with respect to magnetoresistance effect elements comprising an adhesive layer; and FIG. 16 is a table showing rate of change in resistance, resistivity and change in resistivity for a magnetoresistance effect in cases where a magnetic field is applied in a parallel direction to the magnetic field of the laminated film, and is made to describe an M-H curve.

DESCRIPTION OF THE PREFERRED EMBODIMENTS

Figure 3:
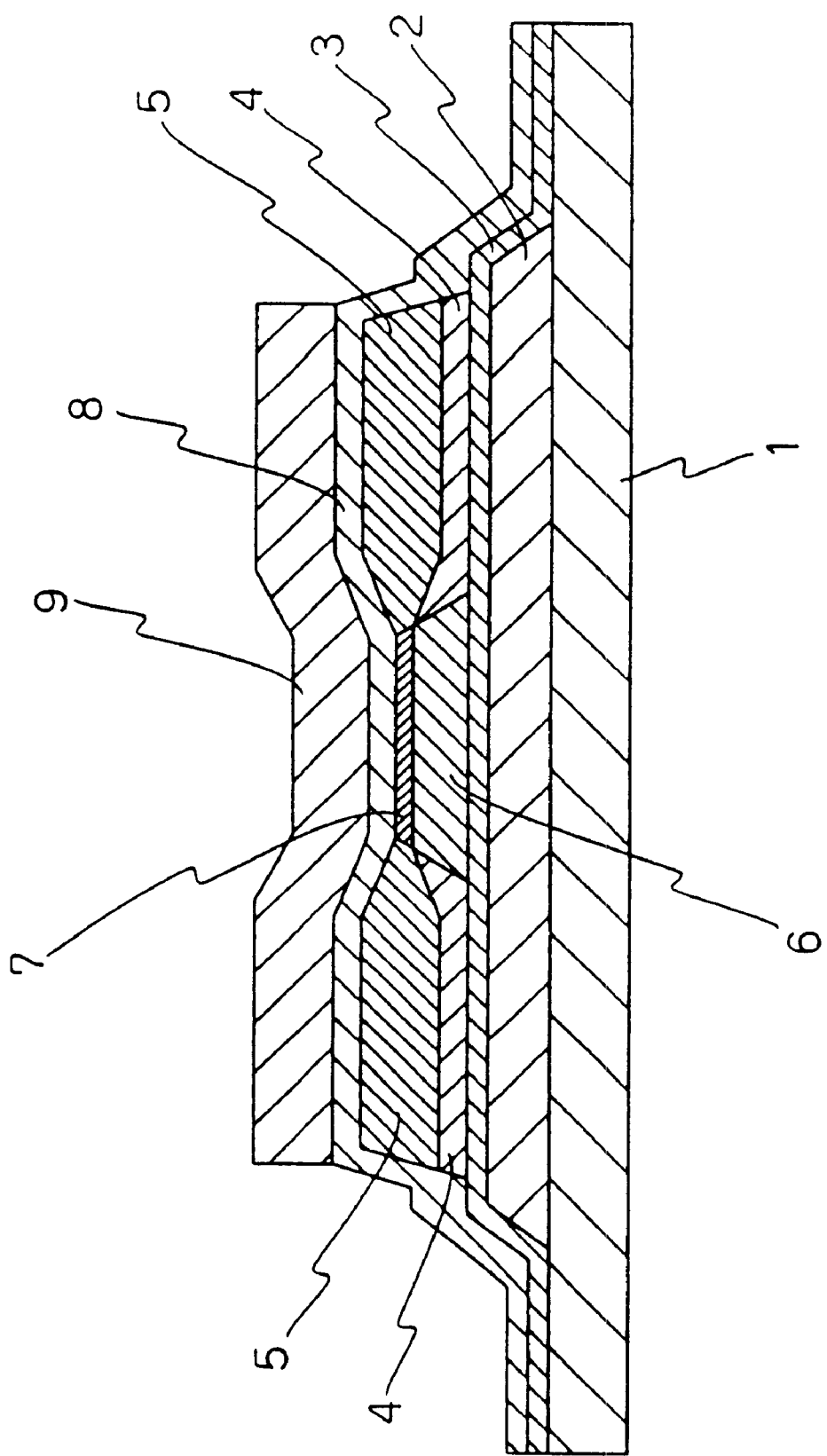
FIG. 3 is a compositional example of a first embodiment of a magnetoresistance effect sensor according to the present invention.

Next, embodiments of the present invention are described with reference to the drawings. FIG. 1 shows a conceptual diagram of a first embodiment of a magnetoresistance effect element according to the present invention. The magnetoresistance effect according to this first embodiment has a structure wherein an adhesive layer 101, an anti-ferromagnetic layer 102, a fixed magnetic layer 103, a non-magnetic layer 105, a free magnetic layer 107 and a protective layer 108 are laminated successively onto a base layer 100.

FIG. 2 shows a conceptual diagram of a second embodiment of a magnetoresistance effect element according to the present invention. The magnetoresistance effect element according to this second embodiment has a structure wherein an adhesive layer 102, a fixed magnetic layer 103, a first MR enhancing layer 104, a non-magnetic layer 105, a second MR enhancing layer 106, a free magnetic layer 107 and a protective layer 108 are laminated successively onto a base layer 100.

Here, the adhesive layer 101 in FIG. 1 and FIG. 2 may be constituted by a single layer film or multiple layer film of Ta, Ta oxide, Ti, Ti oxide, Cr, Cr oxide, V, Fe, Co, Ni, Zr, Nb, Mo, Hf, or W, or a multiple layer film comprising a plurality of these. The anti-ferromagnetic layer 102 may be constituted by a single layer film, multiple layer film, or mixture of Ni oxide, Co oxide or Fe oxide. The fixed magnetic layer 103 may be constituted by a pure metal, alloy or multiple layer film from a group based on Co, Ni and Fe. Desirably, the film thickness is of the order of 1–50 nm. The first MR enhancing layer 104 may be constituted by Co, NiFeCo, FeCo, etc., or an alloy, such as CoFeB, CoZrMo, CoZrNb, CoZr, CoZrTa, CoHf, CoTa, CoTaHf, CoNbHf, CoZrNb, CoHfPd, CoTaZrNb, or CoZrMoNi, or an amorphous magnetic material. Desirably, the film thickness is of the order of 0.5–5 nm. In the example in FIG. 1 where a first MR enhancing layer 104 is not used, the MR ratio is reduced slightly compared to the example in FIG. 2 is an enhancing layer is used, but the number of steps required in fabrication is reduced accordingly.

The non-magnetic layer 105 may be constituted by a material comprising approximately 1–20 at % of Ag added to Cu, a material comprising approximately 1–20 at % of Re added to Cu, or a Cu-Au alloy. Desirably, the film thickness is 2–4 nm. The second MR enhancing layer 106 may be constituted by Co, NiFeCo, FeCo, etc., or an alloy, such as CoFeB, CoZrMo, CoZrNb, CoZr, CoZrTa, CoHf, CoTa, CoTaHf, CoNbHf, CoZrNb, CoHfPd, CoTaZrNb, or CoZrMoNi, or an amorphous magnetic material. Desirably, the film thickness is of the order of 0.5–3 nm. In the example in FIG. 1, where a second MR enhancing layer 106 is not formed, the MR ratio is reduced slightly compared to the example in FIG. 2 where this second MR enhancing layer 106 is used. However, the number of steps required in fabrication is reduced accordingly, due to the second MR enhancing layer 106 not being formed.

The free magnetic layer 107 may be constituted by a single layer, mixture or multiple layer film of Co, NiFeCo, FeCo, etc., or an alloy, such as CoFeB, CoZrMo, CoZrNb, CoZr, CoZrTa, CoHf, CoTa, CoTaHf, CoNbHf, CoZrNb, CoHfPd, CoTaZrNb, or CoZrMoNi, or NiFe, NiFeCo, sendust, an iron nitride material, FeCo, etc., or an amorphous magnetic material. Desirably, the film thickness is of the order of 1–6 nm. If the free magnetic layer 107 is a material based on NiFe, NiFeCo or FeCo, the crystallinity of the free magnetic layer 107 and the non-magnetic layer 105 can be improved and the MR ratio can be raised by using Ta, Hf, Zr, W, or the like, as the base layer 100.

The protective layer 108 may be constituted by an oxide or nitride from a group comprising Al, Si, Ta and Ti, or by a group comprising Cu, Au, Ag, Ta, Hf, Zr, Ir, Si, Pt, Ti, Cr, Al and C, or a mixture of these. Using a protective layer 108 increases resistance to corrosion, but conversely, when a protective layer is not used, the number of fabrication steps is reduced and productivity is raised.

Next, a magnetic resistance sensor according to the present invention is described. FIG. 3 shows a compositional example of a first embodiment of a magnetoresistance effect sensor according to the present invention. In the embodiment in FIG. 3, a lower shield layer 2, a lower gap layer 3, and a magnetoresistance effect element 6 are laminated onto a substrate 1, a longitudinal bias layer 4 and lower electrode layer 5 are laminated successively thereonto such that they contact the terminal section of the magnetoresistance effect element 6, and an upper gap layer 8 and an upper shield layer 9 are laminated successively thereonto. This embodiment has a characteristic feature in that a magnetoresistance effect element of the composition illustrated in FIG. 1 or FIG. 2 is used as the magnetoresistance effect element. 6.

A gap regulation insulating layer 7 may also be layered onto the magnetoresistance effect element 6. In many cases, the lower shield layer 2 is patterned to a suitable size by a photoresist (PR) process. The magnetoresistance effect element 6 is patterned to a suitable size and shape by (PR) processing. This magnetoresistance effect sensor is a shielded sensor comprising a lower shield layer 2 and an upper shield layer 8 for preventing influx of external magnetic field on either side of the magnetoresistance effect element 6, which forms the magnetic sensor section.

Figure 4:
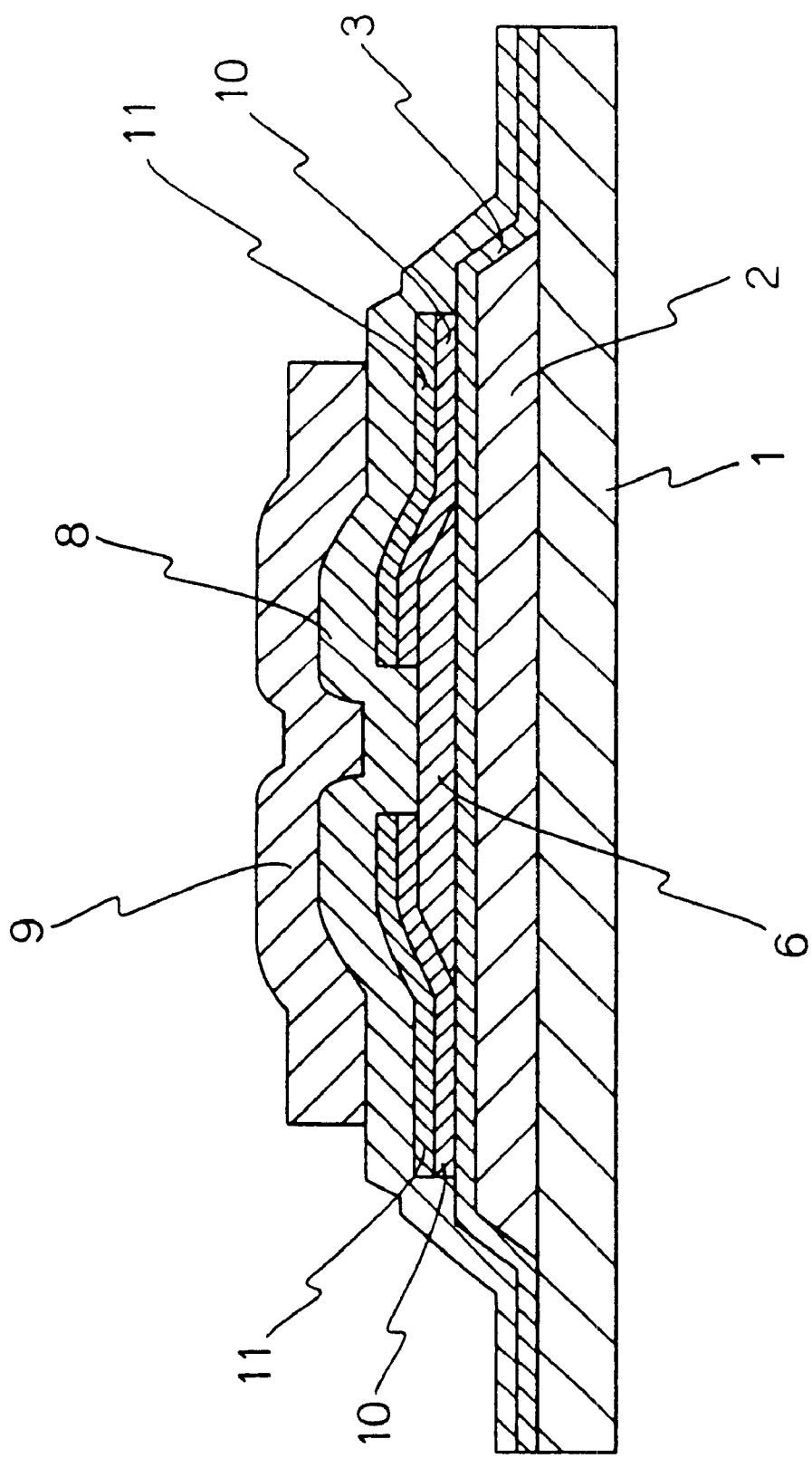
FIG. 4 is a compositional example of a second embodiment of a magnetoresistance effect sensor according to the present invention.

FIG. 4 shows a compositional example of a second embodiment of a magnetoresistance effect sensor according to the present invention. This embodiment is similar to the first embodiment in that a lower shield layer 2, a lower gap layer 3 and a magnetoresistance effect element 6 are laminated onto a substrate 1, and in many cases, the lower shield layer 2 is patterned to a suitable size by PR processing and the magnetoresistance effect element 6 is patterned to a suitable size and shape by PR processing, but this embodiment is characterized in that a longitudinal bias layer 10 and a lower electrode layer 11 are laminated successively thereonto such they overlap partially with the upper portion of the magnetoresistance effect element 6. An upper gap layer 8 and an upper shield layer 9 are laminated successively onto the lower electrode layer 11. This magnetoresistance effect sensor is also a shielded element. The embodiment is also characterized in that a magnetoresistance effect element according to the present invention having a composition as shown in FIG. 1 or FIG. 2 is used as the magnetoresistance effect element 6.

The lower shield layer 2 of the magnetoresistance effect sensor illustrated in FIG. 3 and FIG. 4 may be constituted by NiFe, CoZr, or an alloy, such as CoFeB, CoZrMo, CoZrNb, CoZr, CoZrTa, CoHf, CoTa, CoTaHf, CoNbHf, CoZrNb, CoHfPd, CoTaZrNb, and CoZrMoNi, or FeAlSi, an iron nitride material, or the like. The film thickness may be in the range of 0.5–10 $\mu$m. For the lower gap layer 3, besides alumina, it is also possible to use $SiO_2$, aluminium nitride, silicon nitride, diamond-like carbon, or the like, and desirably the layer thickness is in the range of 0.01–0.20 $\mu$m. The longitudinal bias layers 4, 10 may be constituted by CoCrPt, CoCr, CoPt, CoCrTa, FeMn, NiMn, Ni oxide, NiCo oxide, IrMn, PtPdMn, ReMn, or the like. The lower electrode layers 5, 11 are desirably formed by pure Zr, Ta or Mo, or an alloy or mixture thereof. The film thickness should be in the range of 0.01–0.10 $\mu$m. The gap regulation insulating layer 7 may be constituted by alumina, $SiO_2$, aluminium nitride, silicon nitride, diamond-like carbon, or the like, and desirably, should be formed to a thickness in the range of 0.005–0.05 $\mu$m.

The upper gap layer 8 may be formed from alumina, $SiO_2$, aluminium nitride, silicon nitride, diamond-like carbon, or the like, and desirably, the film thickness should be in the range of 0.01–0.20 $\mu$m. The upper shield layer 9 may be constituted by NiFe, CoZr, CoFeB, CoZrMo, CoZrNb, CoZr, CoZrTa, CoHf, CoTa, CoTaHf, CoNbHf, CoZrNb, CoHfPd, CoTaZrNb, or CoZrMoNi alloy, FeAlSi, an iron nitride material, or the like. A film thickness in the range of 0.5–10 $\mu$m may be used.

The magnetoresistance effect sensor forming the shielded element illustrated in FIG. 3 and FIG. 4 can be used as an integrated recording and playback head, by forming a writing head section by means of an inductive coil.

Figure 5:
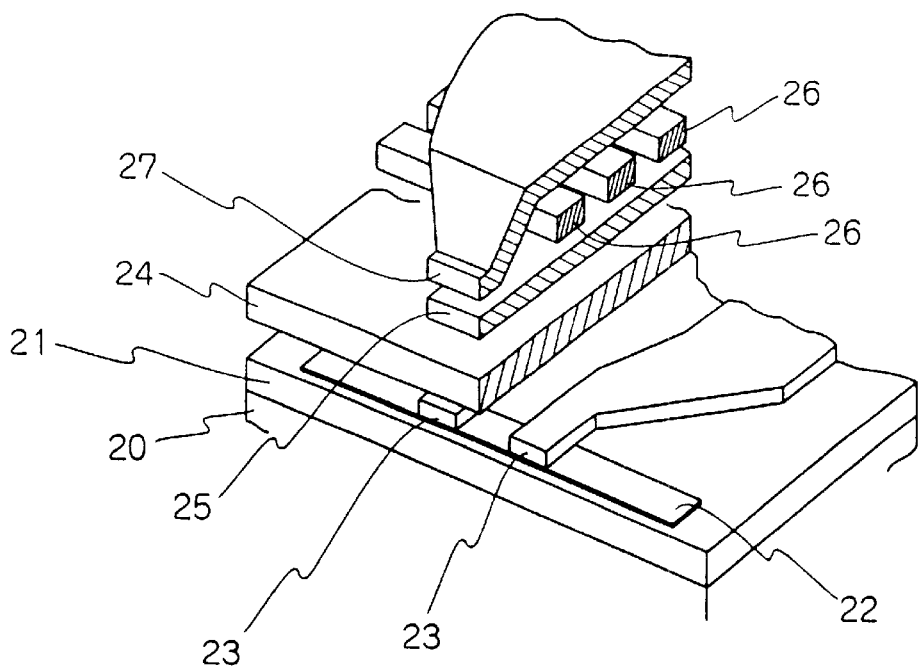
FIG. 5 is a conceptual diagram of one example of an integrated recording and playback head using the present invention.

FIG. 5 shows a conceptual diagram of one example of an integrated recording and playback head. The integrated recording and playback head comprises a playback head using a magnetoresistance effect element according to the present invention, and an inductive-type recording head.

Specifically, this integrated recording and playback head consists of a playback head, comprising an upper shield film 21, a magnetoresistance effect film 22, an electrode film 23 and an upper shield film 24 formed successively onto a base 20, and a recording head, comprising a lower magnetic film 25, a coil 26, and an upper magnetic film 27 provided above the upper shield film 24. The upper shield film 24 and the lower magnetic film 25 may be formed into a common layer. The end portions of the lower magnetic film 25 and the upper magnetic film 27 are located a slight distance apart, thus forming a magnetic gap, and a coil 26 is positioned between the middle portions of the lower magnetic film 25 and the upper magnetic film 27, thereby constituting an inductive-type recording head. Using a head having this structure, signals are written onto a recording medium, and signals are read from a recording medium.

Figure 6:
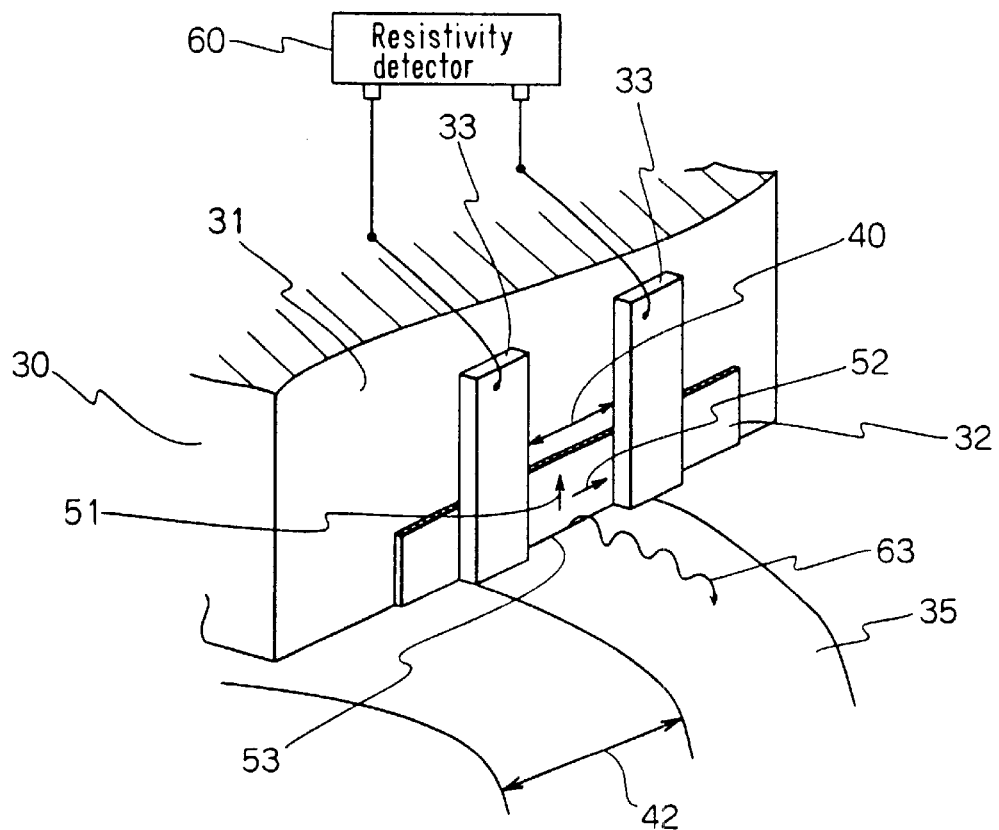
FIG. 6 is a conceptual diagram of one example of a magnetic recording and playback device using a magnetoresistance effect sensor according to the present invention.

The playback head comprising the lower shield film 21, magnetoresistance effect film 22, electrode film 23 and upper shield film 24 is formed by the magnetoresistance effect sensor shown in FIG. 3 and FIG. 4. The magnetoresistance effect film 22 which forms the sensor region of this playback head and the magnetic gap in the recording head are formed in overlapping positions on the same slider, thereby allowing them be positioned simultaneously over the same track. This head is formed onto a slider and is mounted in a magnetic recording and playback device. Here, an installation example in a recording head for longitudinal magnetic recording is shown, but the magnetoresistance effect element of the present invention may also be incorporated in a perpendicular magnetic recording head and used for perpendicular recording. FIG. 6 shows a conceptual diagram of one example of a magnetic recording and playback device using a magnetoresistance effect sensor according to the present invention. The head, comprising one magnetoresistance effect film 32 formed onto a substrate which also incorporates a head slider 30 and two electrode films 33 formed thereonto such that they are mutually parallel in the longitudinal direction, is positioned over the recording medium 35 and conducts a playback operation. During this, the inner sides of the two electrode films 33 form the magnetoresistance effect element width 40. The direction of magnetization 51 of the fixed magnetic layer in the magnetoresistance effect film 32 is virtually orthogonal to the direction of magnetization 52 of the free magnetic layer.

The ABS surface 53 of the magnetoresistance effect element is positioned such that it faces the surface of the recording medium 35. A magnetic recording mark is recorded on the recording medium 35 at the recording track width 42. The recording medium 35 rotates and the head slider 30 moves relative to the recording medium 35 at a height of 0.2 $\mu$m or less thereabove or in a state of contact therewith. By means of this structure, the magnetoresistance effect film 32 is set in a position whereby it can read magnetic signals recorded on the recording medium 35 by means of the leakage magnetic field 63 therefrom. In practice, the change in resistivity of the magnetoresistance effect element is detected by the resistivity detector 60 in FIG. 6. Next, specific examples of magnetoresistance effect elements relating to the present invention are described.

(1) Using a Ni oxide anti-ferromagnetic layer A magnetoresistance effect element is formed having a structure wherein a 50 nm-thick Ni oxide film forming the anti-ferromagnetic layer 102 in FIG. 2, a 3 nm-thick Co90Fe10 film forming the fixed magnetic layer 103, a 2.5 nm-thick Cu film forming the non-magnetic layer 105, a 1 nm-thick Co90Fe10 film forming the second MR enhancing layer 106, and a 5 nm-thick Ni80Fe20 film forming the free magnetic layer 107 are laminated successively onto a glass substrate, (namely, a glass substrate/Ni oxide (50 nm)/Co90Fe10 (3 nm)/Cu(2.5 nm)/Co90Fe10 (1 nm)/Ni80Fe20 (5 nm) structure). In other words, this magnetoresistance effect element is of the composition shown in FIG. 2, omitting the first MR enhancing layer 104.

Film lamination is conducted using a magnetron sputtering device in an applied magnetic field of 500 (Oe). When a magnetic field was applied to this magnetoresistance effect element in a parallel direction to the magnetic field during lamination, and this magnetic field was made to follow an M-H curve, a resistance change rate of 7% was obtained. The resistivity of the element was 25 $\mu\Omega$cm at zero applied magnetic field, and the resistivity change was 1.75 $\mu\Omega$cm. Next, to compare with the present invention, elements were trial manufactured without an adhesive layer, and their current tolerance characteristics were investigated. Elements respectively comprising 1 $\mu$m-thick films of alumina, alumina nitride, Si nitride, and Si oxide as a base layer 100 laminated onto a glass substrate were prepared, along with an element which did not comprise a base layer, whereupon films of Ni oxide (50 nm)/Co90Fe10 (3 nm)/Cu (2.5 nm)/Co90Fe10 (1 nm)/Ni80Fe20 (5 nm) were laminated separately thereonto, the elements were processed to a size of 2×50 $\mu$m by photoresist processing using a mask, and milling, and the ends thereof were formed into Au electrode sections. Therefore, these elements did not comprise an adhesive layer 101 as shown in FIG. 1 and FIG. 2.

The elements were subjected to a high-temperature current test at an environmental temperature of 120° C. and current density of $3\times10^7$ A/cm$^2$. When a certain time was reached, peeling occurred between the NiO film and the base layer 100, and the elements burnt out. The times at which this peeling occurred and the elements burnt out are shown in FIG. 10. Next, elements respectively comprising 1 $\mu$m-thick films of alumina, alumina nitride, Si nitride, and Si oxide as a base layer 100 laminated onto a glass substrate were prepared, along with an element which did not comprise a base layer, whereupon films of an adhesive layer/Ni oxide (50 nm)/Co90Fe10 (3 nm)/Cu (2.5 nm)/Co90Fe10 (1 nm)/Ni80Fe20 (5 nm) were laminated separately thereonto, the elements were processed to a size of 2×50 $\mu$m by photoresist processing using a mask, and milling, and the ends thereof were formed into Au electrode sections.

For the adhesive layer 101, Ta, Ta oxide, Ti, Ti oxide, Cr, Cr oxide, V, Fe, Co, Ni, Zr, Nb, Mo, Hf and W were used. The elements were subjected to a high-temperature current test at an environmental temperature of 120° C. and current density of $3\times10^7$ A/cm$^2$. The times at which peeling occurred and the elements broke down in this case are shown in FIG. 11. When the characteristics shown in FIG. 11 obtained when an adhesive layer 101 is used are compared with the characteristics shown in FIG. 12 obtained when no adhesive layer 101 is used, it can be seen that in all cases current tolerance characteristics are improved in the elements relating to the present invention, which comprise an adhesive layer 101.

(2) Using an Ni oxide/Fe oxide dual-layer anti-ferromagnetic layer

A magnetoresistance effect element was fabricated having a structure wherein a 50 nm-thick film of Ni oxide layered on a 2 nm-thick film of Fe oxide forming the anti-ferromagnetic layer 102 in FIG. 2, a 3 nm-thick film of Co90Fe10 forming the fixed magnetic layer 103, a 2.5 nm-thick film of Cu forming a non-magnetic layer 105, a 1 nm-thick film of Co90Fe10 forming a second MR enhancing layer 106, and a 5 nm-thick film of Ni80Fe20 forming a free magnetic layer 107 are laminated successively onto a glass substrate (in other words, a glass substrate/Ni oxide (50 nm)/Fe oxide (2 nm)/Co90Fe10 (3 nm)/Cu (2.5 nm)/Co90Fe10 (1 nm)/Ni80Fe20 (5 nm) structure. Namely, the magnetoresistance effect element is of the composition shown in FIG. 2, omitting the first MR enhancing layer 104.

The film lamination was conducted using a magnetron sputtering device in an applied magnetic field of 500 (Oe). When a magnetic field was applied to this magnetoresistance effect film in a parallel direction to the magnetic field during lamination, and this magnetic field was made to follow an M-H curve, a resistance change rate of 6.3% was obtained. The resistivity of the element was 24 $\mu\Omega$cm at zero applied magnetic field, and the resistivity change was 1.51 $\mu\Omega$cm.

Next, to compare with the present invention, elements were trial manufactured without an adhesive layer, and their current tolerance characteristics were investigated. Elements respectively comprising 1 $\mu$m-thick films of alumina, alumina nitride, Si nitride, and Si oxide as a base layer 100 laminated onto a glass substrate were prepared, along with an element which did not comprise a base layer, whereupon films of Ni oxide (50 nm)/Fe oxide (2 nm)/Co90Fe10 (3 nm)/Cu (2.5 nm)/Co90Fe10 (1 nm)/Ni80Fe20 (5 nm) were laminated thereonto, the elements were processed to a size of 2×50 $\mu$m by photoresist processing using a mask, and milling, and the ends thereof were formed into Au electrode sections. These elements without an adhesive layer 101 were subjected to a high-temperature current test at an environmental temperature of 120° C. and current density of $3\times10^7$ A/cm$^2$. When a certain time was reached, peeling occurred between the NiO film and the base layer, and the elements burnt out. The times at which this peeling occurred and the elements burnt out are shown in FIG. 12.

Next, elements respectively comprising 1 $\mu$m-thick films of alumina, alumina nitride, Si nitride, and Si oxide as a base layer 100 laminated onto a glass substrate were prepared, along with an element which did not comprise a base layer, whereupon films of an adhesive layer/Ni oxide (50 nm)/Fe oxide (2 nm)/Co90Fe10 (3 nm)/Cu (2.5 nm)/Co90Fe10 (1 nm)/Ni80Fe20 (5 nm) were laminated thereonto, the elements were processed to a size of 2×50 $\mu$m by photoresist processing using a mask, and milling, and the ends thereof were formed into Au electrode sections.

For the adhesive layer 101, Ta, Ta oxide, Ti, Ti oxide, Cr, Cr oxide, V, Fe, Co, Ni, Zr, Nb, Mo, Hf and W were used. The elements comprising an adhesive layer 101 were subjected to a high-temperature current test at an environmental temperature of 120° C. and current density of $3\times10^7$ A/cm$^2$. The times (unit: hours) at which peeling occurred and the elements broke down in this case are shown in FIG. 13.

By comparing FIG. 12 and FIG. 13, it can be seen that in all cases, the current tolerance characteristics are improved in the elements shown in FIG. 13, which comprise an adhesive layer 101.

(3) Using an Fe oxide anti-ferromagnetic layer A magnetoresistance effect element was fabricated having a structure wherein a 40 nm-thick film of Fe oxide forming the anti-ferromagnetic layer 102 in FIG. 2, a 3 nm-thick film of Co90Fe10 forming the fixed magnetic layer 103, a 2.5 nm-thick film of Cu forming a non-magnetic layer 105, a 1 nm-thick film of Co90Fe10 forming a second MR enhancing layer 106, and a 5 nm-thick film of Ni80Fe20 forming a free magnetic layer 107 are laminated successively onto a glass substrate (in other words, a glass substrate Fe oxide (40 nm)/Co90Fe10 (3 nm)/Cu (2.5 nm)/Co90Fe10 (1 nm)/Ni80Fe20 (5 nm) structure. Namely, the magnetoresistance effect element is of the composition shown in FIG. 2, omitting the first MR enhancing layer 104.

The film lamination was conducted using a magnetron sputtering device in an applied magnetic field of 500 (Oe). When a magnetic field was applied to this magnetoresistance effect film in a parallel direction to the magnetic field during lamination, and this magnetic field was made to follow an M-H curve, a resistance change rate of 6.3% was obtained. The resistivity of the element was 24 $\mu\Omega$cm at zero applied magnetic field, and the resistivity change was 1.51 $\mu\Omega$cm.

Next, to compare with the present invention, elements were trial manufactured without an adhesive layer, and their current tolerance characteristics were investigated. Elements respectively comprising 1 $\mu$m-thick films of alumina, alumina nitride, Si nitride, and Si oxide as a base layer 100 laminated onto a glass substrate were prepared, along with an element which did not comprise a base layer, whereupon films of Fe oxide (40 nm)/Co90Fe10 (3 nm)/Cu (2.5 nm)/Co90Fe10 (1 nm)/Ni80Fe20 (5 nm) were laminated thereonto, the elements were processed to a size of 2×50 $\mu$m by photoresist processing using a mask, and milling, and the ends thereof were formed into Au electrode sections. These elements without an adhesive layer 101 were subjected to a high-temperature current test at an environmental temperature of 120° C. and current density of 3×10$^7$ A/cm$^2$. When a certain time was reached, peeling occurred between the NiO film and the base layer, and the elements burnt out. The times at which this peeling occurred and the elements burnt out are shown in FIG. 12.

Next, elements respectively comprising 1 $\mu$m-thick films of alumina, alumina nitride, Si nitride, and Si oxide as a base layer 100 laminated onto a glass substrate were prepared, along with an element which did not comprise a base layer, whereupon films of an adhesive layer/Fe oxide (40 nm)/Co90Fe10 (3 nm)/Cu (2.5 nm)/Co90Fe10 (1 nm)/Ni80Fe20 (5 nm) were laminated thereonto, the elements were processed to a size of 2×50 $\mu$m by photoresist processing using a mask, and milling, and the end s thereof were formed into Au electrode sections. For the adhesive layer 101, Ta, Ta oxide, Ti, Ti oxide, Cr, Cr oxide, V, Fe, Co, Ni, Zr, Nb, Mo, Hf and W were used. These elements comprising an adhesive layer 101 were subjected to a high-temperature current test at an environmental temperature of 120° C. and current density of 3×10$^7$ A/cm$^2$. The times (unit: hours) at which peeling occurred and the elements broke down in this case are show n in FIG. 15.

When the characteristics of elements which do not comprise an adhesive layer 101 as shown in FIG. 14 are compared with the characteristics of elements which do comprise an adhesive layer 101, it can be seen that in all cases current tolerance characteristics are improved in the elements which comprise an adhesive layer 101.

Thereupon, magnetoresistance effect films were trial manufactured using various magnetic layers as an embodiment of a magnetoresistance effect element 10 which can be applied to the present invention, and the rate of change in resistance, the resistivity and the change in resistivity were measured.

Firstly, magnetoresistance effect films were fabricated having a structure wherein a 10 nm-thick film of Ta forming the adhesive layer 101 in FIG. 2, a 50 nm-thick film of Ni forming the anti-ferromagnetic layer 102, a 3 nm-thick film of Co90Fe10 forming the fixed magnetic layer 103, a 2.5 nm-thick film of Cu forming the non-magnetic layer 105, a 1 nm-thick film of Co90Fe10 forming the second MR enhancing layer 106, and a 6 nm-thick fixed magnetic layer are laminated onto a glass substrate (namely, a glass substrate/Ta (10 nm)/Ni oxide (50 nm)/Co90Fe10 (3 nm)/Cu (2.5 nm)/fixed magnetic layer (6 nm) structure), and a variety of alloys were used for the fixed magnetic layer. The film lamination was conducted using a magnetron sputtering device in an applied magnetic field of 500 (Oe).

FIG. 16 shows the rate of change in resistance, the resistivity and change in resistivity when a magnetic field was applied to these magnetoresistance effect elements in a parallel direction to the magnetic field during lamination and this magnetic field was made to follow an M-H curve.

Thereupon, a magnetoresistance effect element was fabricated having a structure wherein a 10 nm-thick film of Ta oxide forming the adhesive layer 101 in FIG. 2, a 50 nm-thick film of Ni oxide forming the anti-ferromagnetic layer 102, a 1.5 nm-thick film of Co90Fe10 forming the fixed magnetic layer 103, a 1.5 nm-thick film of Co74Zr6Mo20 forming the first MR enhancing layer 104, a 2.5 nm-thick film of Cu forming the non-magnetic layer 105, and a 6 nm-thick film of Co74Zr6Mo20 forming the second MR enhancing layer 106 are laminated successively onto a glass substrate (namely, a glass substrate/Ta oxide (10 m)/Ni oxide (50 nm)/Co90Fe10 (1.5 nm)/Co74Zr6Mo20 (1.5 nm)/Cu (2.5 nm)/Co74Zr6Mo20 (6 nm) structure).

The film lamination was conducted using a magnetron sputtering device in an applied magnetic field of 500 (Oe). When a magnetic field was applied to this magnetoresistance effect film in a parallel direction to the magnetic field during lamination, and this magnetic field was made to follow an M-H curve, a resistance change rate of 6.0% was obtained. The resistivity of the element was 65 $\mu\Omega$cm at zero applied magnetic field, and the resistivity change was 3.9 $\mu\Omega$cm.

Thereupon, a magnetoresistance effect element was fabricated having a structure wherein a 10 nm-thick film of Zr oxide forming the adhesive layer 101 in FIG. 2, a 50 nm-thick film of Ni oxide forming the anti-ferromagnetic layer 102, a 1.5 nm-thick film of Co90Fe10 forming the fixed magnetic layer 103, a 1.5 nm-thick film of Co74Zr6Mo20 forming the first MR enhancing layer 104, a 2.5 nm-thick film of Cu forming the non-magnetic layer 105, a 3 nm-thick film of Co74Zr6Mo20 forming the second MR enhancing layer 106, and Ni80Fe20 forming a free magnetic layer 107 are laminated successively onto a glass substrate (namely, a glass substrate/Zr oxide (10 nm)/Ni oxide (50 nm)/Co90Fe10 (1.5 nm)/Co74Zr6Mo20 (1.5 nm)/Cu (2.5 nm)/Co74Zr6Mo20 (3 nm)/Ni80Fe20 structure).

The film lamination was conducted using a magnetron sputtering device in an applied magnetic field of 500 (Oe). When a magnetic field was applied to this magnetoresistance effect film in a parallel direction to the magnetic field during lamination, and this magnetic field was made to follow an M-H curve, a resistance change rate of 5.0% was obtained. The resistivity of the element was 45 $\mu\Omega$cm at zero applied magnetic field, and the resistivity change was 2.25 $\mu\Omega$m.

Thereupon, a magnetoresistance effect element was fabricated having a structure wherein a 10 nm-thick film of Ti forming the adhesive layer 101 in FIG. 2, a 50 nm-thick film of Ni oxide forming the anti-ferromagnetic layer 102, a 3 nm-thick film of Co90Fe10 forming the fixed magnetic layer 103, a 2.5 nm-thick film of Cu forming the first MR enhancing layer 104, a 3 nm-thick film of Co92Zr3Nb5 forming the non-magnetic layer 105, a 0.4 nm thick film of Ru forming the second MR enhancing layer 106, and a 3 nm-thick film of Co92Zr3Nb5 forming the free magnetic layer 107 are laminated successively onto a glass substrate (namely, a glass substrate/Ti (10 nm)/Ni oxide (50 nm)/ Co90Fe10 (3.0 nm)/Cu (2.5 nm)/Co92Zr3Nb5 (3 nm)/Ru (0.4 nm)/Co92Zr3Nb5 (3 nm) structure).

The film lamination was conducted using a magnetron sputtering device in an applied magnetic field of 500 (Oe). When a magnetic field was applied to this magnetoresistance effect film in a parallel direction to the magnetic field during lamination, and this magnetic field was made to follow an M-H curve, a resistance change rate of 4.8% was obtained. A magnetoresistance effect element of this composition had a satisfactory magnetic field sensitivity even when it was patterned to a width of 1 µm. This is thought to be because the effective magnetization of the free magnetic layer is extremely small due to anti-ferromagnetic coupling of the two Co92Zr3Nb5 layers via the Ru layer in the Co92Zr3Nb5 (3 nm)/Ru (0.4 nm)/Co92Zr3Nb5 (3 nm) section, and therefore the magnetostatic bonding between the fixed magnetic layer and the free magnetic layer is also small. The resistivity of the element was 43 µΩcm at zero applied magnetic field, and the resistivity change was 2.1 µΩcm. Next, a magnetoresistance effect element as illustrated in FIG. 2 was fabricated having a structure of : glass substrate/W (10 nm)/Ni oxide (50 nm)/Co90Fe10 (2 nm)/Ru (0.4 nm)/ Co90Fe10 (2 nm)/Cu (2.5 nm)/Co92Zr3Nb5 (3 nm). The film lamination was conducted using a magnetron sputtering device in an applied magnetic field of 500 (Oe). When a magnetic field was applied to this magnetoresistance effect film in a parallel direction to the magnetic field during lamination, and this magnetic field was made to follow an M-H curve, a resistance change rate of 4.9% was obtained. A magnetoresistance effect element of this composition had a satisfactory magnetic field sensitivity even when it was patterned to a width of 1 µm. This is thought to be because the effective magnetization of the free magnetic layer is extremely small due to anti-ferromagnetic coupling of the two CoFe layers (fixed magnetic layers) via the Ru layer in the Co90Fe10 (2 nm)/Ru (0.4 nm)/Co90Fe10 (2 nm) section constituting the fixed magnetic layer 103 (in other words, the sandwich film comprising a first fixed magnetic layer, a non-magnetic layer and a second fixed magnetic layer), and therefore the magnetostatic bonding between the fixed magnetic layer and the free magnetic layer is also small. The resistivity of the element was 41 µΩcm at zero applied magnetic field, and the resistivity change was 2.0 µΩcm. Next, a magnetoresistance effect element as illustrated in FIG. 2 was fabricated having a structure wherein a 10 nm-thick film of Cr forming the adhesive layer 101 in FIG. 1, a 50 nm-thick film of Ni oxide forming the anti-ferromagnetic layer 102, a multi-layer film comprising a 3 nm-thick film of Co90Fe10, a 0.4 nm-thick film of Ru and a 3 nm-thick film of Co90Fe10 forming the fixed magnetic layer 103, a 2.5 nm-thick film of Cu forming the non-magnetic layer 105, and a multilayer film comprising a 3 nm-thick film of Co92Zr3Nb5, a 0.4 nm-thick film of Ru and a 3 nm-thick film of Co92Zr3Nb5 forming a free magnetic layer 107 are fabricated successively onto a glass substrate (in other words, a glass substrate/Cr (10 nm)/Ni oxide (50 nm)/Co90Fe10 (3 nm)/Ru (0.4 nm)/Co90Fe10 (3 nm)/Cu (2.5 nm)/Co92Zr3Nb5 (3 nm)/Ru (0.4 nm)/Co92Zr3Nb5 (3 nm) structure). The film lamination was conducted using a magnetron sputtering device in an applied magnetic field of 500 (Oe). When a magnetic field was applied to this magnetoresistance effect film in a parallel direction to the magnetic field during lamination, and this magnetic field was made to follow an M-H curve, a resistance change rate of 4.5% was obtained.

A magnetoresistance effect element of this composition had a satisfactory magnetic field sensitivity even when it was patterned to a width of 1 µm. This is thought to be because the effective magnetization of the free magnetic layer is extremely small due to anti-ferromagnetic coupling of the two CoFe layers via the Ru layer in the multi-layer film comprising Co90Fe10 (3 nm)/Ru (0.4 nm)/Co90Fe10 (3 nm) which constitutes the magnetic layer 103 (in other words, the two fixed magnetic layers in the sandwich layer comprising a first fixed magnetic layer, a non-magnetic layer, and a second fixed magnetic layer), and anti-ferromagnetic coupling of the two Co92Zr3Nb5 layers via the Ru layer in the multilayer film comprising Co92Zr3Nb5 (3 nm)/Ru (0.4 nm)/Co92Zr3Nb5 (3 nm) which constitutes the free magnetic layer 107 (in other words, the two magnetic layers in the sandwich film comprising a first magnetic layer, a non-magnetic layer and a second magnetic layer), and therefore the magnetostatic bonding between the fixed magnetic layer and the free magnetic layer is also small. The resistivity of the element was 38 µΩcm at zero applied magnetic field, and the resistivity change was 1.7 µΩcm.

Next, a description is given of examples wherein these magnetoresistance effect elements are applied to shielded elements.

Firstly, an element was fabricated for use in a magnetoresistance effect sensor in a shielded element of the type shown in FIG. 3. In this, NiFe was used as a lower shield layer 2, and alumina was used as a lower gap layer 3. The magnetoresistance effect element 6 was fabricated using Ta (5 nm) as an adhesive layer 101, Ni oxide (50 nm) as an anti-ferromagnetic layer 102, Fe oxide (2 nm) as a fixed magnetic layer 103, Co90Fe10 (3 nm) as a first MR enhancing layer 104, Cu (2.5 nm) as a non-magnetic layer 105, and Co92Zr3Nb5 (6 nm) as a free magnetic layer 107, and the element was processed to a size of 1×1 µm by PR processing. A CoCrPt and Mo lower electrode layer 5 was formed such that it contacted the terminal section of the magnetoresistance effect element 6. Alumina was used as an upper gap layer 8 and NiFe was used as an upper shield layer 9.

A magnetoresistance effect sensor of this composition was processed into an integrated recording and playback head as illustrated in FIG. 5, which was formed onto a slider, and data recording and playback was conducted to and from a CoCrTa-type medium. In this, the write track width was 1.5 µm, the write gap was 0.2 µm, the read track width was 1.0 µm, and the read gap was 0.21 µm. The coercive force of the medium was 2.5 k(Oe). When the playback output was measured at different recording mark lengths, the frequency became 155 kFCI at the mark length were the playback output was halved. The playback output was 2.7 mV peak-to-peak, and a noiseless waveform of good symmetry was obtained. The S/N ratio was 26.6 dB, and the error rate was $10^{-6}$ or less. When this head was subjected to an environmental test at 80° C. and 500 (Oe), the error rate showed no change at all during a period up to 2500 hours. Furthermore, when this head was subjected to a current tolerance test under conditions of current density $2 \times 10^7$ A/cm² and environmental temperature 80° C., the resistance value and rate of change in resistance both remained unchanged up to 1000 hours.

Next, an element was fabricated using an anti-ferromagnetic material according to the present invention in a shielded element of the type shown in FIG. 4. This element comprises FeTaN as the lower shield layer 2, amorphous carbon as the lower gap layer 3, and a structure of Ti (5 nm)/Ni oxide (50 nm)/Fe oxide (2 nm)/Co90Fe10 (3 nm)/Cu (2.5 nm)/Co92Zr3Nb5 (6 nm) as the magnetoresistance effect element 6, and it is processed to a size of 1×1 μm by PR processing. A CoCrPt and Mo lower electrode layer 11 is laminated onto this element section such that it overlaps with a portion thereof. Alumina was used as the upper gap layer 8 and NiFe as the upper shield layer 9.

This head was processed into an integrated recording and playback head as illustrated in FIG. 5, which was formed onto a slider, and data recording and playback was conducted to and from a CoCrTa-type medium. In this, the write track width was 1.5 μm, the write gap was 0.2 μm, the read track width was 1.0 μm, and the read gap was 0.21 μm. The coercive force of the medium was 2.5 k(Oe). When the playback output was measured at different recording mark lengths, the frequency became 1100 kFCI at the mark length where the playback output was halved. The playback output was 2.5 mV peak-to-peak, and a noiseless waveform of good symmetry was obtained. The S/N ratio was 26.8 dB, and the error rate was 10−6 or less. When this head was subjected to an environmental test at 80° C. and 500 (Oe), the error rate showed no change at all during a period up to 2500 hours. Furthermore, when this head was subjected to a current tolerance test under conditions of current density $2\times10^7$ A/cm$^2$ and environmental temperature 80° C., the resistance value and rate of change in resistance both remained unchanged up to 1000 hours.

Next, a magnetic disk device which was trial manufactured by applying the present invention is described. The magnetic disk device is provided with three magnetic disks on a base, and a head drive circuit, signal processing circuit and an input/output interface are provided on the rear side of the base. The device is connected externally by means of a 32-bit bus line. A total of 6 heads are positioned separately on either side of the magnetic disks. A rotary actuator for driving the head, drive and control circuits for the actuator, and a spindle-coupled motor for rotating the disks are provided in the disk device.

The magnetic disks are 46 mm in diameter, and of this diameter, the region from 10 mm to 40 mm is used for data recording and playback. Using a buried servo system, a high density can be achieved, since there is no servo face. The device can be connected directly as an external recording device of a miniature computer. A cache memory is provided in the input/output interface, which corresponds to a bus line with a transfer rate in the region of 5 to 20 Mb per second. By providing an external controller and connecting a plurality of devices like the present device, a high-capacity magnetic disk device can be constructed.

As described above, according to the present invention, it is possible to obtain a magnetoresistance effect element having excellent reliability, wherein the adhesive force between the oxide anti-ferromagnetic thin film and the base layer is increased and no peeling of this oxide anti-ferromagnetic thin film from the base layer occurs even in a high-temperature current tolerance test, and a magnetoresistance effect sensor, a shielded magnetoresistance effect element, a recording and playback head, and a recording and playback system, wherein this magnetoresistance effect element is applied.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-064265 (Filed on Mar. 18th, 1997) including specification, claims, drawings and summary are incorporated herein by reference in its entirety.

What is claimed is:

1. A magnetic information recording and playback system, comprising:
   (a) a magnetoresistance effect element for detecting a magnetic field, wherein the magnetoresistance effect element comprises an anti-ferromagnetic layer, a fixed magnetic layer, a non-magnetic layer and a free magnetic layer laminated successively onto a base layer,
      said anti-ferromagnetic layer is a single layer film or multiple layer film comprising Ni oxide, Co oxide or Fe oxide as a principal component, or a mixture of these, and
      an adhesive layer for preventing peeling due to heat generated by the flow of current is provided between the base layer and the anti-ferromagnetic layer;
   (b) electrodes for supplying a sensor current to said magnetoresistance effect element; and
   (c) a resistance detector for detecting the change in resistivity of said magnetoresistance effect element as a function of the detected magnetic field.

2. A magnetic information recording and playback system, comprising:
   (a) a magnetic recording medium having a plurality of tracks for recording data;
   (b) a magnetic recording head for recording data on the magnetic recording medium; and
   (c) a magnetoresistance effect element for reproducing data on the magnetic recording medium, wherein the magnetoresistance effect element comprises an anti-ferromagnetic layer, a fixed magnetic layer, a non-magnetic layer and a free magnetic layer laminated successively onto a base layer,
      said anti-ferromagnetic layer is a single layer film or multiple layer film comprising Ni oxide, Co oxide or Fe oxide as a principal component, or a mixture of these, and
      an adhesive layer for preventing peeling due to heat generated by the flow of current is provided between the base layer and the anti-ferromagnetic layer.

* * * * *

UNITED STATES PATENT AND TRADEMARK OFFICE
CERTIFICATE OF CORRECTION

PATENT NO. : 6,456,468 B1
DATED : September 24, 2002
INVENTOR(S) : Kazuhiko Hayashi It is certified that error appears in the above-identified patent and that said Letters Patent is hereby corrected as shown below:

Column 2,
Line 50, delete "oth erromagnetic" and insert -- other ferromagnetic --;
Line 58, delete "i" and insert -- in --;

Column 12,
Line 25, delete "(10m)" insert -- (10nm) --

Signed and Sealed this

Twenty-fourth Day of June, 2003

JAMES E. ROGAN
*Director of the United States Patent and Trademark Office*